United States Patent [19]

Parmet et al.

[11] 4,425,626

[45] Jan. 10, 1984

[54] APPARATUS FOR TRANSLATION OF CHARACTER CODES FOR APPLICATION TO A DATA PROCESSING SYSTEM

[75] Inventors: Arthur A. Parmet, Burlington; Charles W. Dawson, East Bridgewater, both of Mass.

[73] Assignee: Honeywell Information Systems Inc., Waltham, Mass.

[21] Appl. No.: 98,456

[22] Filed: Nov. 29, 1979

[51] Int. Cl.[3] .................................... G06F 3/00
[52] U.S. Cl. ............................................ 364/900
[58] Field of Search ... 364/200 MS File, 900 MS File; 340/146.3 D, 146.3 Z

[56] References Cited

U.S. PATENT DOCUMENTS

| | | | |
|---|---|---|---|
| 3,578,953 | 5/1971 | Milford | 340/146.3 Z |
| 3,959,777 | 5/1976 | Kimmel | 364/900 |
| 4,003,033 | 1/1977 | O'Keefe et al. | 364/200 |
| 4,016,549 | 4/1977 | Hutner | 364/900 |
| 4,104,718 | 8/1978 | Poublan et al. | 364/200 |
| 4,201,978 | 5/1980 | Nally | 340/146.3 D |

*Primary Examiner*—Gareth D. Shaw
*Assistant Examiner*—John G. Mills
*Attorney, Agent, or Firm*—George Grayson; Nicholas Prasinos

[57] ABSTRACT

A reader/sorter reads documents which include MICR, OMR and OCR encoded characters. The reader/sorter reads each type of character sequentially at separate read head positions. Character codes read by a particular head address a separate area of address locations in a random access memory which stores equivalent character codes which are used by the data processing system. The random access memory is loaded with the translated character codes, allowing a data processing system to communicate with the reader/sorter.

4 Claims, 8 Drawing Figures

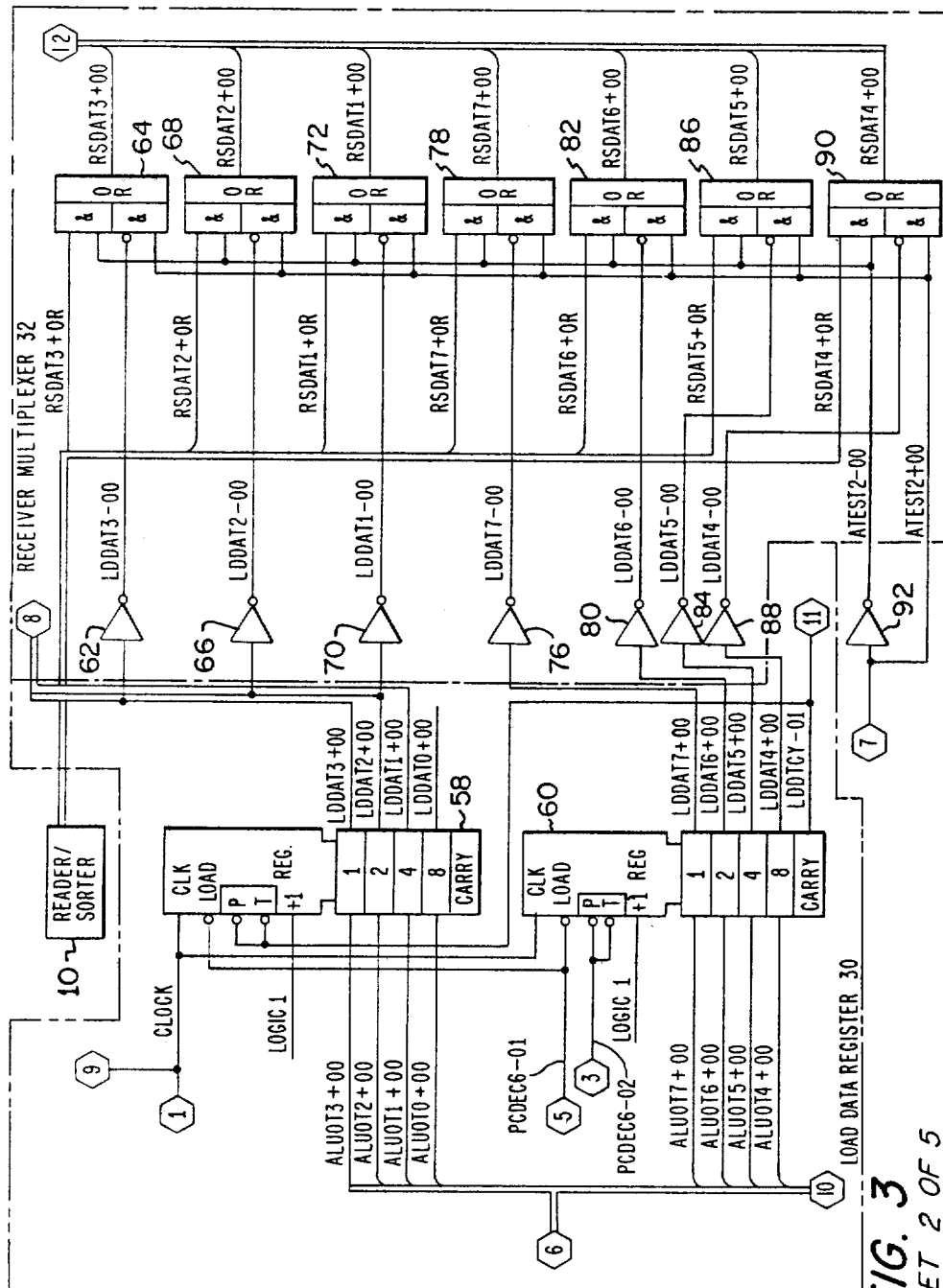

APPARATUS FOR TRANSLATION OF CHARACTER CODES FOR APPLICATION TO A DATA PROCESSING SYSTEM

RELATED APPLICATION

The following U.S. patent application filed on an even date with the instant application and assigned to the same assignee as the instant application is related to the instant application.

1. "Queue Symbol Field Recovery Flags for Defining Boundaries of One or More Fields of a Document Read by a Reader Sorter" by Arthur A. Parmet and Charles W. Dawson, and having U.S. Ser. No. 098,274.

BACKGROUND OF THE INVENTION

1. Field of Use

This invention relates generally to the reading of documents by a reader/sorter, for selecting a pocket into which the document is sorted and, more specifically, to the translation of document character codes into data processor character codes.

2. Description of the Prior Art

A reader/sorter typically has one or more read heads for reading fields of information on documents such as checks having MICR, OMR, or OCR encoded data fields. The information is read by the reader/sorter, processed by a controller, and transferred to a central processor unit which, under software control and in real time, selects a pocket for sorting the document. The character codes read from the documents include a number of special characters as well as numeric and alphabetic characters.

Prior art systems having a reader sorter on a subsystem interpreted the codes by means of time-consuming software routines.

To improve the code translation performance, later reader/sorter data processing systems such as Honeywell H200 Data Processing System, used a programmable read only memory (PROM) to translate character codes. This however, made for an inflexible system limited to only one character code set. This inflexibility is particularly evident when the data processing system and reader/sorter are linked to a variety of foreign host processing systems (normally via a communications link). The data must be translated via time-consuming software routines from the native-to-foreign code set prior to file transmission.

It should be understood that the references cited herein are those which the applicants are aware of and are presented to acquaint the reader with the level of skill in the art and may not be the closest reference to the invention. No representation is made that any search has been conducted by the applicants.

OBJECTS OF THE INVENTION

Accordingly, it is a primary object of the invention to provide a document sorting system with improved performance.

It is another object of the invention to provide a document sorting system with code conversion tables which may be readily specified by the data processing system's user to match the application.

It is still another object of the invention to provide a document sorting system whereby separate code conversion tables may be provided for each reading head of the reader/sorter device.

BRIEF DESCRIPTION OF THE DRAWINGS

The novel features which are characteristic of the invention are set forth with particularity in the appended claims. The invention itself, however, both as to organization and operation, may best be understood by reference to the following description in conjunction with the drawings in which:

SUMMARY OF THE INVENTION

A reader/sorter having a number of read heads is coupled to a data processing system through a controller and an adapter. Documents having characters in various forms are read sequentially on one pass through the reader/sorter. A first read head may read MICR (Magnetic Ink Character Recognition) characters, a second read head may read OMR (Optical Mark Recognition) characters, and the third and fourth read heads may read OCR (Optical Character Recognition) characters. The characters are encoded in the reader/sorter which generates character code signals.

Random Access Memories (RAM) in the adapter are organized in four quadrants, each quadrant associated with a read head. During a load operation, the four RAM quadrants are loaded by the controller with translated character code signals as specified by the software. A load data register counter and a translation table quadrant counter are initialized. The load data register counter output signals are applied to the RAM address selection terminals through a receiver/multiplexer. The translation table quadrant counter output signals are applied directly to the RAM address selection terminals.

The translated character code signals sent from the controller are loaded into a status select register and then stored in an address location of RAM defined by the load data output signals and the translation table quadrant counter signals. The load data register/counter is incremented by one, and the next translated character code signals are sent to the adapter from the controller for storage in the RAM. When the first quadrant of RAM address locations is loaded, the load data register counter is in the reset condition and the translation table quadrant register is incremented to address the second quadrant associated with the second read head. The load operation is continued until all four RAM quadrants are loaded with translated character code signals.

During normal device read operation, the translation table quadrant register indicates the active read head. A character read by the read head is encoded into character code signals and transferred to the adapter through the receiver/multiplexer and applied to the RAM address selection terminals. The selected translated character code signals are transferred to the controller for further processing.

DESCRIPTION OF THE PREFERRED EMBODIMENT

Figure 1:
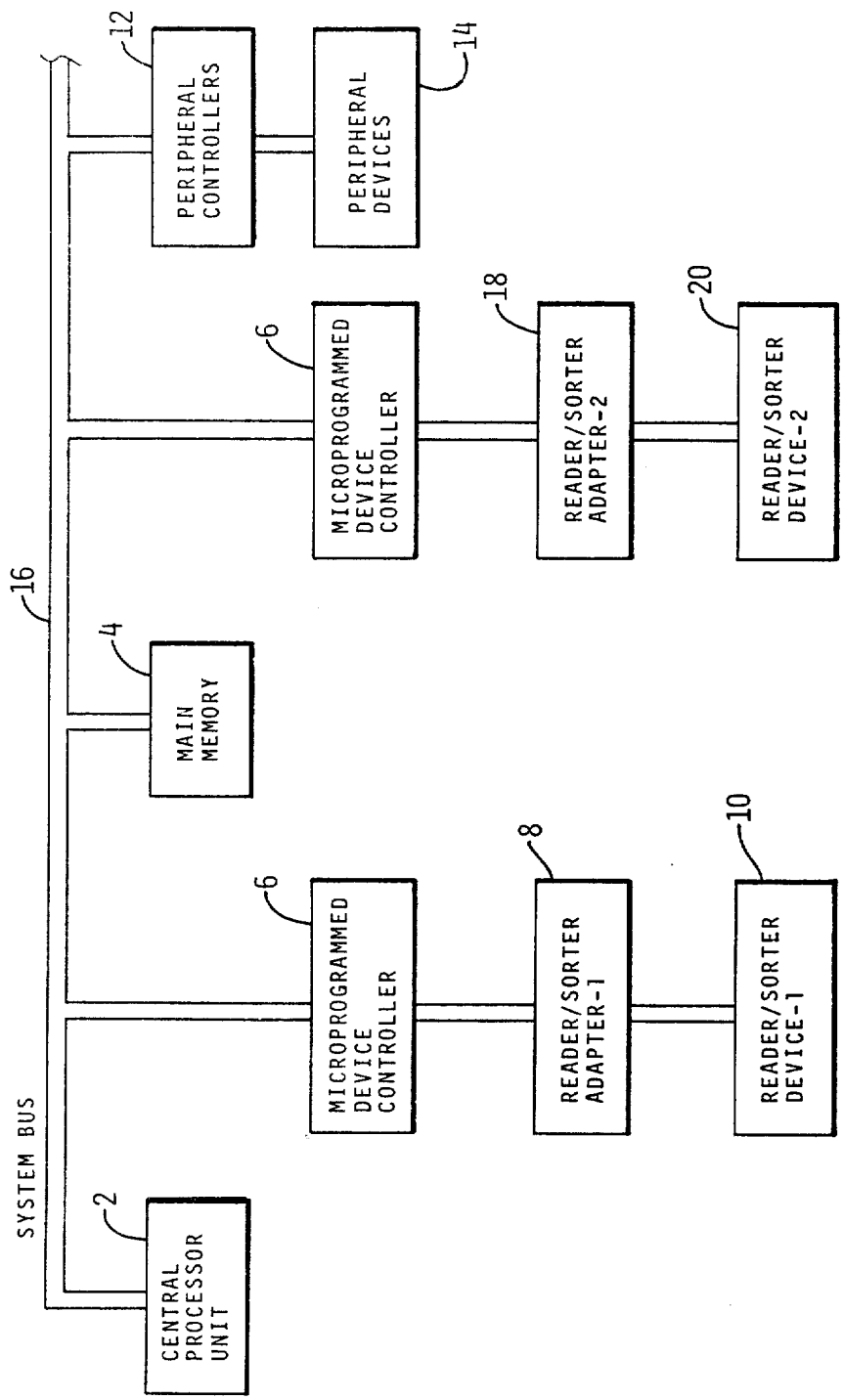
FIG. 1 is an overall block diagram of the system.

FIG. 1 shows the document processing system, which includes a central processor unit (CPU) 2, a main memory 4, a plurality of peripheral controllers 12, and a plurality of microprogrammed device controllers (MDC) 6, all coupled in common to a system bus 16.

Coupled to the MDC 6 may be a reader/sorter Adapter 1 (RSA1) 8 or a Reader Sorter Adapter 2 (RSA2) 18. A Reader/Sorter Device-1(RSD-1) 10, which may be a Honeywell Model DHU9840 device, is coupled to the RSA1 8; and a Reader/Sorter Device-2 (RSD-2) 20, which may be a Honeywell Model 234-0 or a 236, is coupled to the RSA2 18.

The MDC 6 is disclosed in U.S. Pat. No. 4,003,033 entitled, "Architecture for a Microprogrammed Device Controller" and by this reference is incorporated into and made part of this specification.

The document process system reads documents in the Reader/Sorter Device-1 10 sequentially from up to four read heads. A first read head reads MICR (Magnetic Ink Character Recognition) characters, a second read head reads OMR words (Optical Mark Recognition) and the third and fourth read heads read OCR (Optical Character Recognition) characters. The information from the document is read through the RSA1 8 and MDC 6 onto the system bus 16 to main memory 4, and is processed by the CPU 2. Selected characters may be stored in main memory 4 for further processing.

The CPU 2 processes the information under program control and sends return signals via the system bus 16, the MDC 6, and the RSA1 8 to the Reader/Sorter Device-1 10, thereby indicating the pocket into which the document is sorted.

The MDC 6 is a microprogrammed peripheral controller which performs general purpose control functions such as executing system bus sequences, providing command storage, transferring and editing data, and establishing the general flow of command execution.

The RSA1 8 contains all the unique hardware necessary to dialog with the Reader/Sorter Device-1 10.

This embodiment describes the relationship between the MDC 6 and the RSA1 8. It is understood that RSA2 18 and Reader/Sorter Device-2 20 operate with the MDC 6 in a similar manner as RSA1 8.

Figure 2:
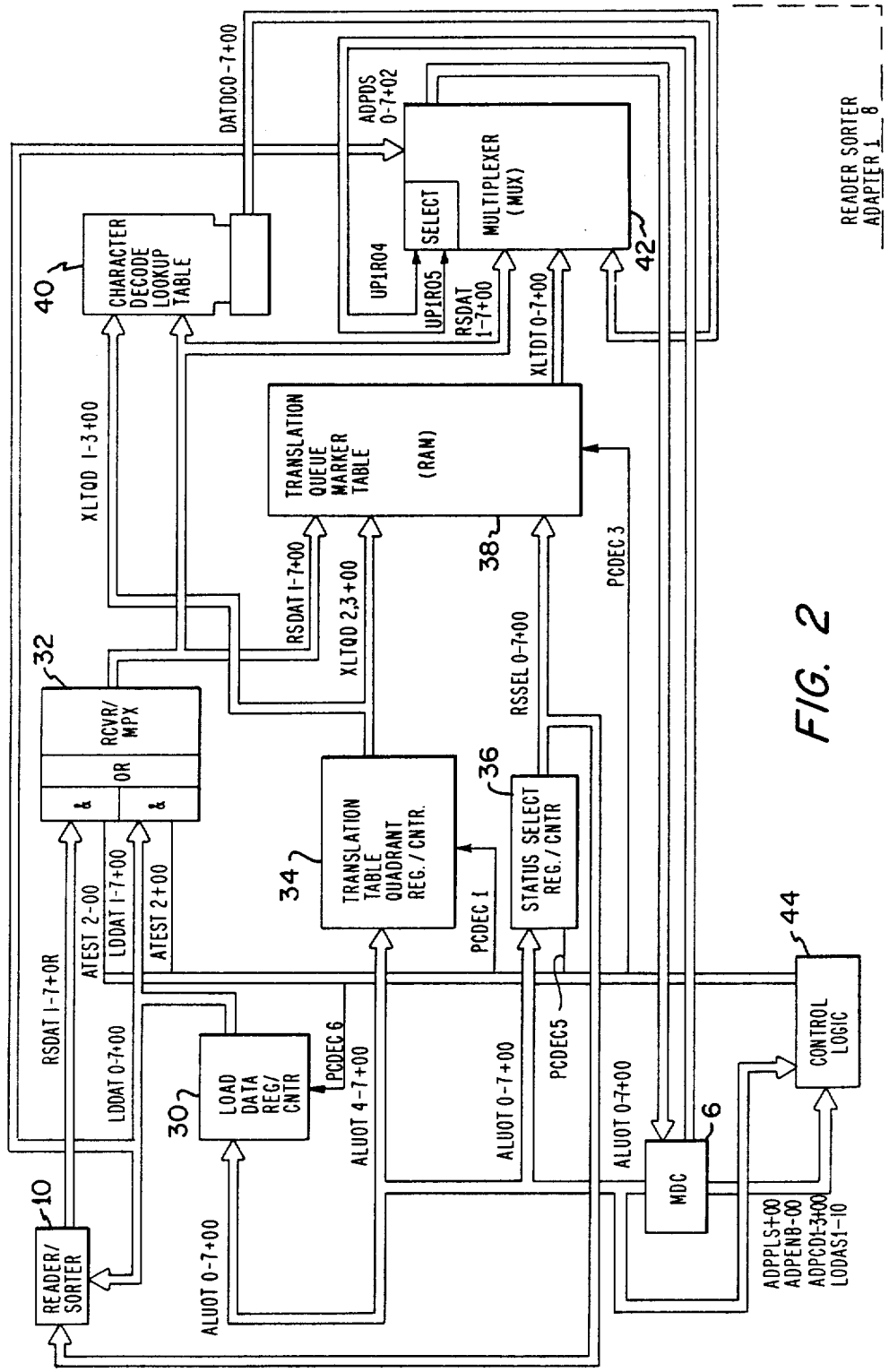
FIG. 2 is a block diagram of the reader/sorter adapter.

Referring to FIG. 2, the RSA1 8 includes a Translation and Queue Marker Table Random Access Memory (RAM) 38 for storing, in 512 addressable locations, character codes which are transferred to a multiplexer 42 as signals XLTDT 0-7+00, and, in turn, to the MDC 6 as signals ADPDS 0-7+02.

Document character code signals are applied to a receiver/multiplexer 32 of RSA1 8 as signals RSDAT 1-7+OR (7 bits), and are applied to the address select terminals of RAM 38 to select the address locations storing the equivalent character code for transfer to MDC 6. A code identifying the particular head reading the document is stored in a Translation Table Quadrant Register/Counter 34. Signals XLTQD 2,3+00, applied to the address select terminals of RAM 38, select the 128 address locations in RAM 38 storing corresponding characters associated with a particular head.

| Head Number | Character Field | XLTQD 2 3 |
|---|---|---|
| 1 | MICR | 0 0 |
| 2 | OMR | 0 1 |
| 3 | OCR | 1 0 |
| 4 | OCR | 1 1 |

The RAM 38 is loaded initially with character codes that will be used by the CPU 2. These character codes include format characters, font select characters and data characters, and may be ASCII, EBCDIC binary coded decimal, or any other appropriate code as required for the current sorting application.

A Load Data Register/Counter 30 applies output signals LDDAT 0-7−00 to receiver multiplexer 32. The Counter 30 is initially set to hexidecimal ZERO and incremented through 128 address locations under firmware control. Similarly, Counter 34 is reset to binary ZERO and incremented once every 128 character transfers for writing the 512 character codes into RAM 38.

The character code is applied to a Status Select Register/Counter 36 from the MDC 6 via signals ALUOT 0-7+00 and applied to RAM 38 as signals RSSEL 0-7+00.

RAM 38, therefore, is loaded initially with the character codes required by the CPU 2.

During the reading of the document, the characters are translated into the required code by RAM 38. Signals LDDAT 0-7+00 are applied to the Reader/Sorter Device-1 10 and indicate the pocket into which the document is to be sorted.

The Reader/Sorter Adapter-1 8 is controlled by logic signals ADPPLS+00, ADPENB−00, ADPCD1-3+00, and LODAS1−10 which are applied to control logic 44 from MDC 6. Output signals PCDEC 1,3,5 and 6 initiate the required cycles of loading, clearing, writing and incrementing as shown in the timing diagram of FIG. 4.

Character code signals RSDAT 1-7+00 and translation table quadrant signals XLTQD 1-3+00 are applied to the address selection terminals of a character decode lookup Table 40. Output signals DATDC0-7+00 are coded to indicate the type of character received by RSA1 8; that is, if it is a numeric, an alphabetic, a control, or a formatting character. This is described in further detail in copending related application Ser. No. 098,274 entitled, "Queue Symbol Field Recovery Flags for Defining Boundaries of One or More Fields of a Document Read by a Reader Sorter".

Signals UP1RO4 and UP1RO5 are generated by MDC 6 and applied to the select terminals of MUX 42 to transfer the selected MUX 42 output signals to MDC 6. Signals ATEST2+00 and ATEST2−00, applied to RCVR/MPX 32, are generated by control logic 44 to select either the load operation or the translate operation.

Figure 3:
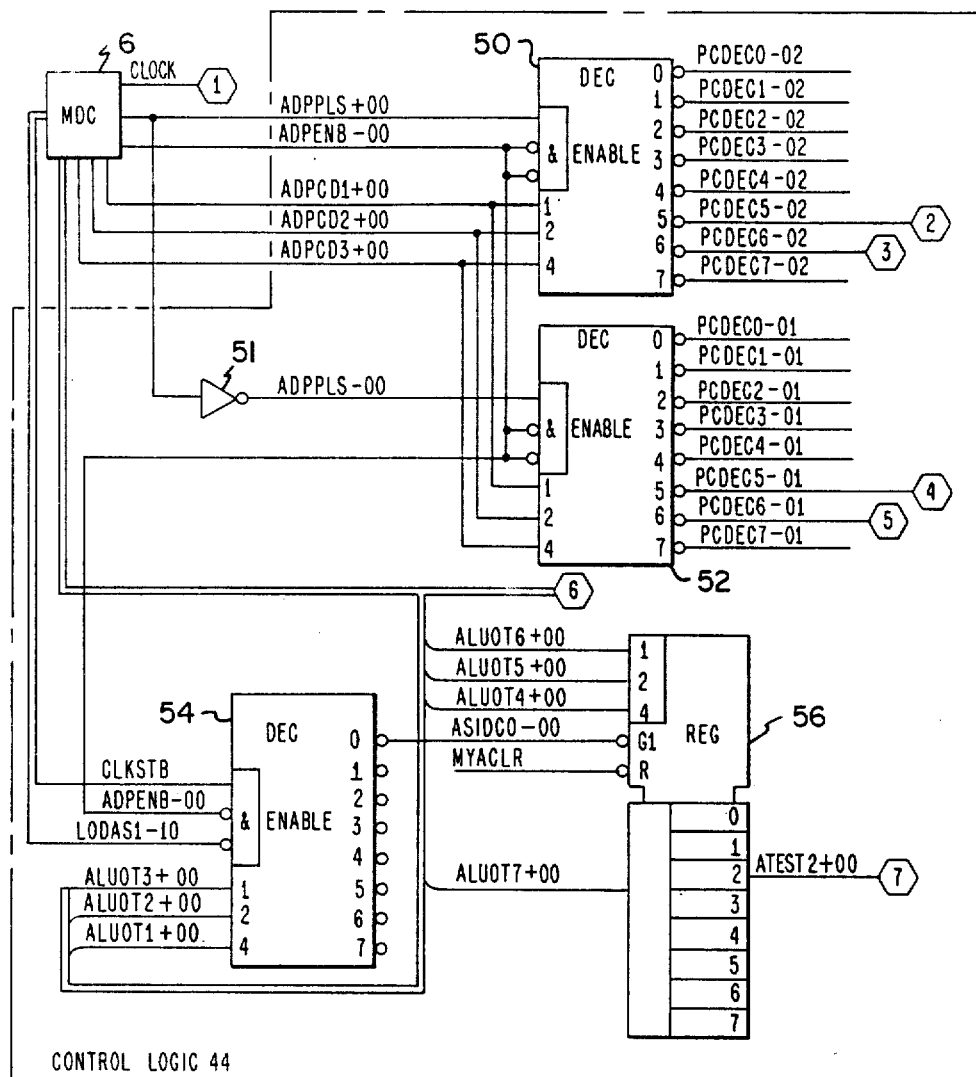
FIG. 3 is a detailed logic diagram of the reader/sorter adapter.
Figure 3:
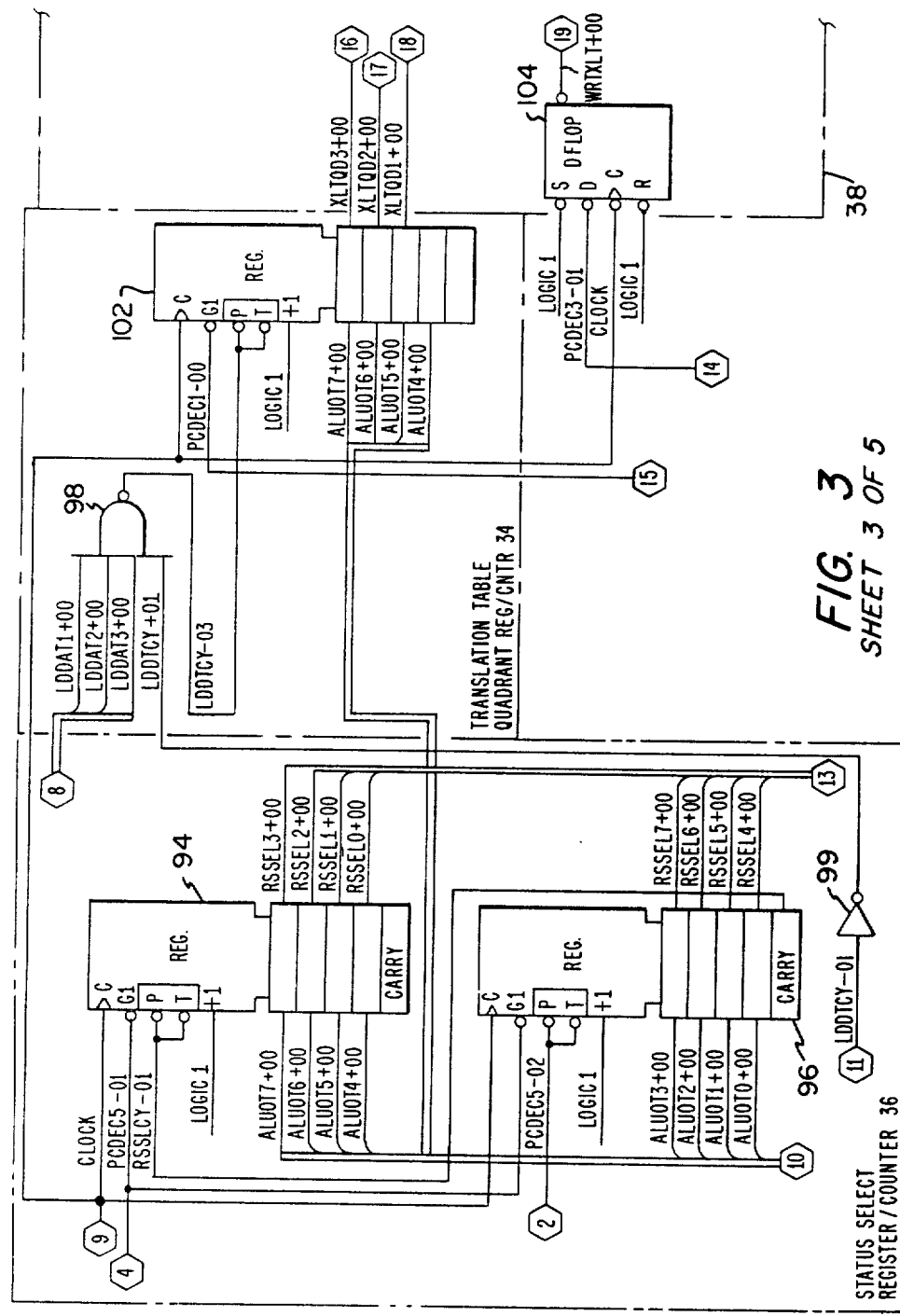
Figure 3:
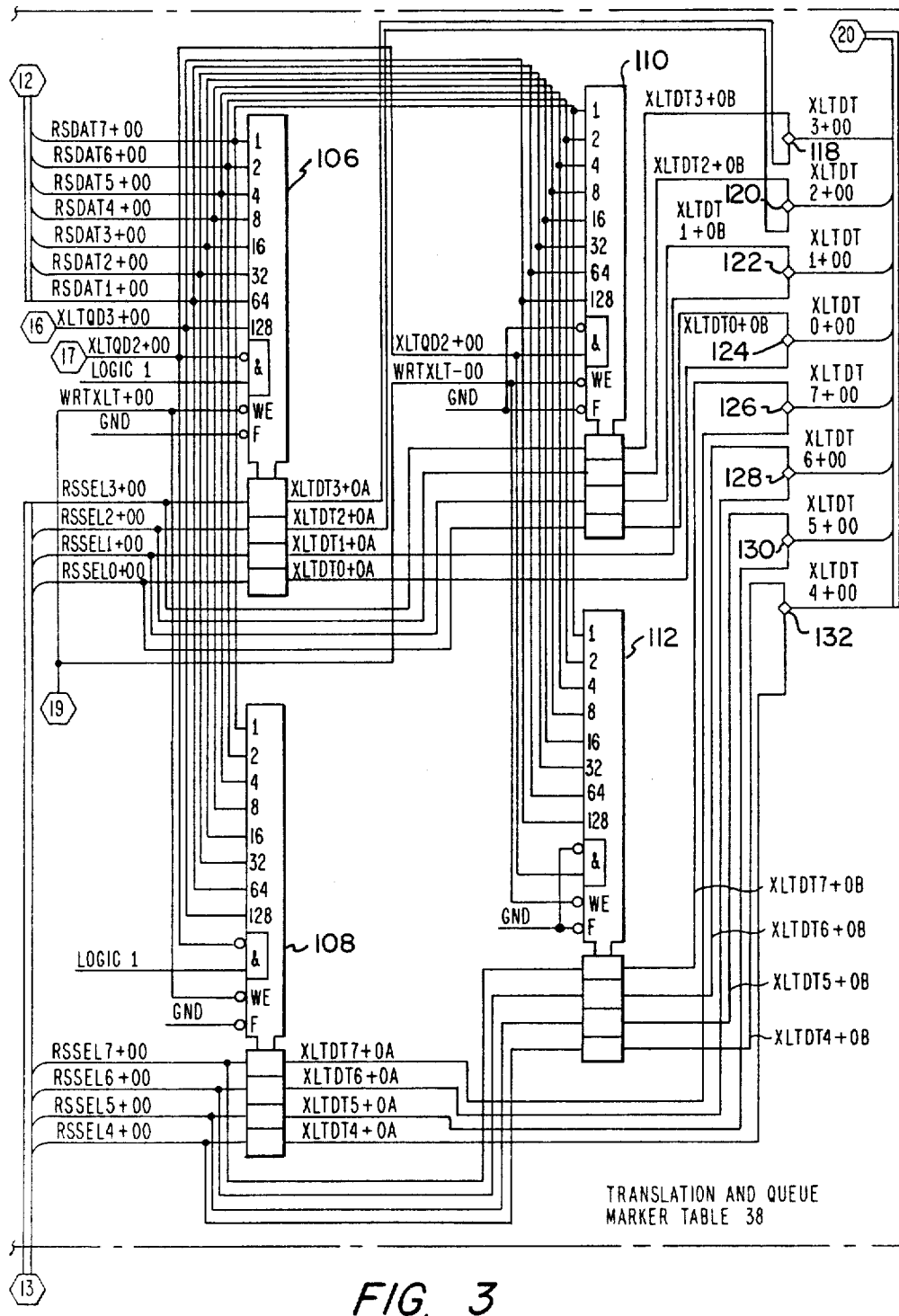
Figure 3:
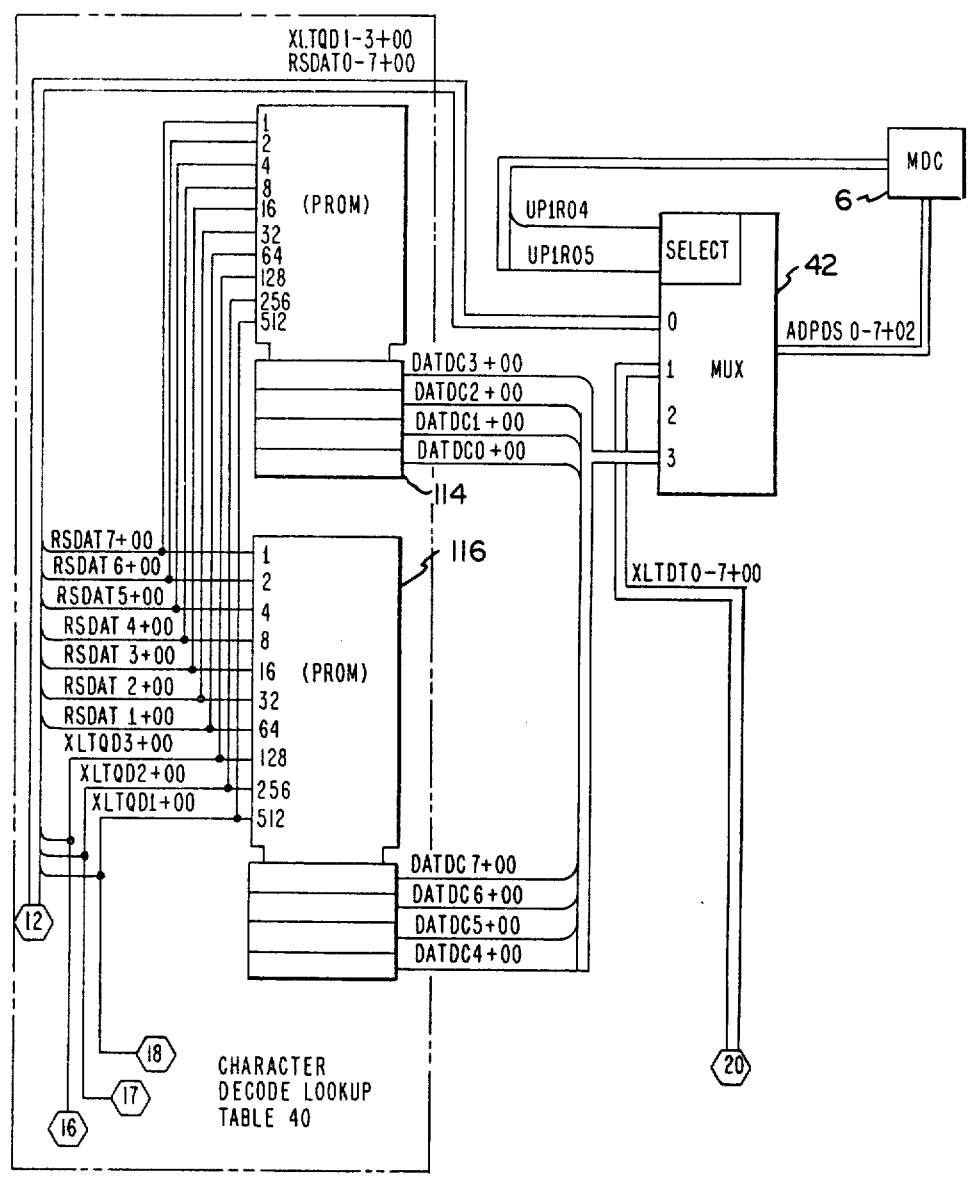

Referring to FIG. 3, the Translation and Queue Marker Table RAM 38 includes random access memories RAM 106, 108, 110 and 112 which are 2101A memory circuits described in the Intel Data Catalog 1978, pages 3-26. The catalog is published by Intel Corporation, 3015 Bowers Avenue, Santa Clara, Calif. 95051.

During the document reading operation, character code signals are received from Reader/Sorter 10 over signal lines RSDAT1-7+OR, and are applied to receiver/multiplexer 32, which includes receiver/multiplexers 6 68, 72, 78, 82, 86 and 90. Control signal ATEST2−00 is at logical ONE for the document reading operation. Output signals RSDAT1-7+00 are applied to the address select inputs of RAMs 106, 108, 110 and 112. Counter 102 of Translation Table Quadrant Register/Counter 34 provides signal XLTQD2+00, which enables RAMs 106 and 108 or RAMs 110 or 112. Signal XLTQD3+00 is applied to the address select terminal 128. Address locations 000 through 127$_{10}$ of RAMs 106 and 108 store characters decoding the characters on the document read by head 1. Address locations $128_{10}$ through $255_{10}$ of RAMs 106 and 108 store characters decoding the characters on the document read by head 2. Similarly, address locations 000 through $127_{10}$ of RAMs 110 and 112 are associated with head 3, and address locations $128_{10}$ through $255_{10}$ with head 4.

The output of RAMs 106 and 108, signals XLTDT 0-7+OA, and RAMs 110 and 112, signals XLTDT 0-7+OB, are applied to wired OR circuits 118 through 132. The output signals XLDT 0-7+00 are applied to input terminal 1 of MUX 42.

Initially the RAMs 106, 108, 110 and 112 are loaded with character codes compatible with the data processing system of the Document Processing System, namely, the CPU 2, main memory 4, and MDC 6. The character codes include data characters as well as control characters.

The load operation is initiated by MDC 6 sending hexadecimal 05 over signal lines ALUOT 1-7+00 with control signals ADPENB−00 and LODAS1−10 at logical ZERO to Control Logic 44. This enables a decoder 54 and output signal ASIDCO−00, forced to logical ZERO at the rise of clock strobe signal CLKSTB, enables the loading of a register 56. Since signals ALUOT5+00 and ALUOT7+00 are at logical ONE, output signal ATEST2+00 is at logical ONE. Signal ATEST2−00, the output of an inverter 92, is at logical ZERO. This selects the load signals LDDAT 1-7−00, the output of inverters 62, 66, 70, 76, 80, 84 and 88, through receiver/multiplexers 64, 68, 72, 78, 82, 86 and 90, as output signals RSDAT 1-7+00. This is shown in clock cycle A of the timing chart of FIG. 4. On the next clock cycle (cycle B, FIG. 4), hexadecimal 00 is sent over signal lines ALUOT 0-7+00 along with signals ADPENB−00 and ADPPLS+00 at logical ZERO, thereby enabling a decoder 52. Signal ADPPLS−00 is at logical ONE as the output of an inverter 51. Output signal PCDEC6−01 at logical ZERO is applied to the LOAD terminals of load data registers 58 and 60. Signal ADPCD1+00 is at logical ZERO and signals ADPCD2+00 and ADPCD3+00 are at logical ONE. Hexadecimal 00 is set into registers 58 and 60 since signals ALUOT 0-7+00 are at logical ZERO.

Figure 4:
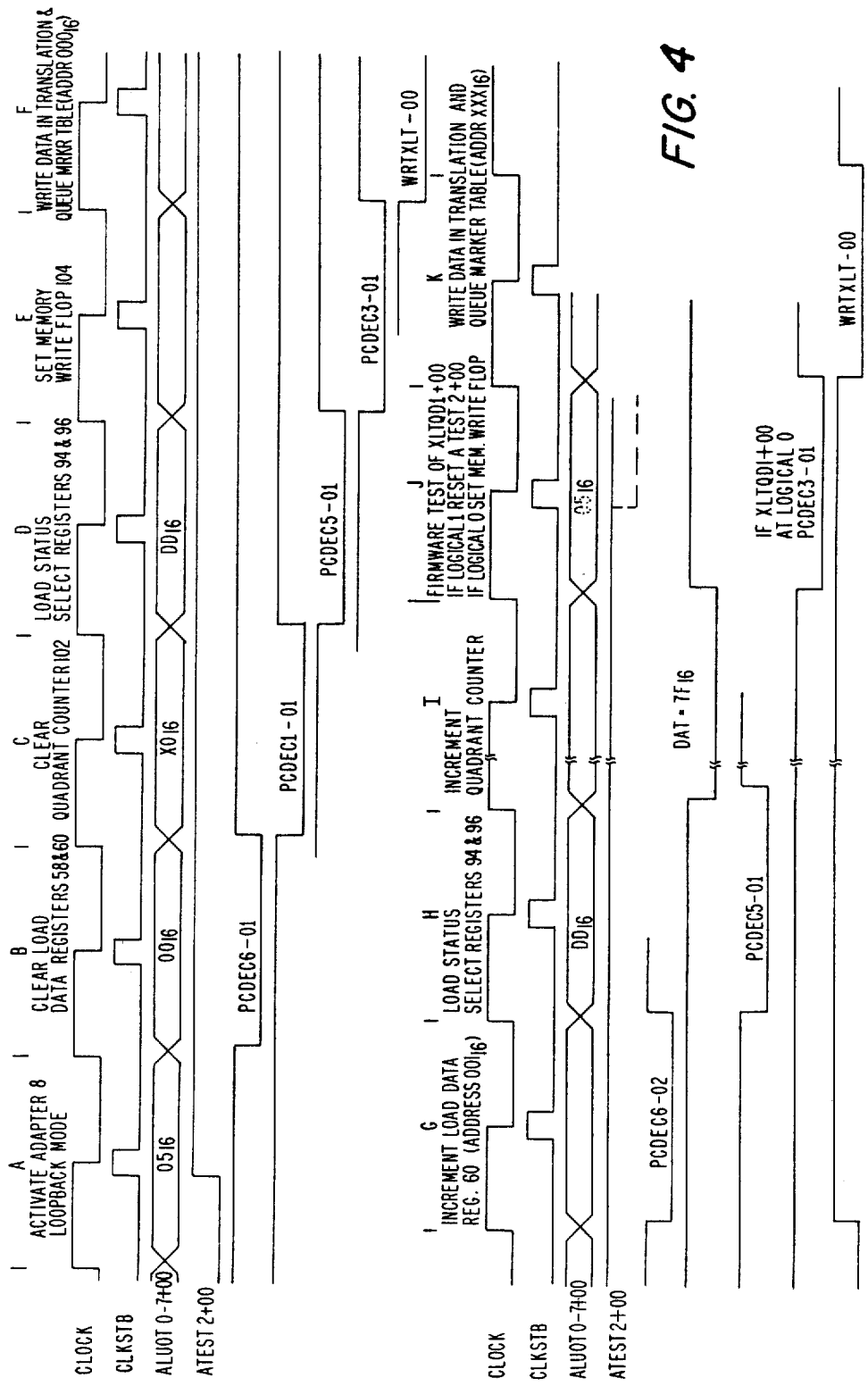
FIG. 4 is a timing diagram showing load data operation.

Signals ALUOT 4-7+00 are at logical ZERO during clock cycle C, FIG. 4, and signals from MDC 6 force the PCDEC 1−01 output signal of decoder 52 to logical ZERO. This forces counter 102 to hexadecimal ZERO for decoding the address locations of RAMs 106 and 108 with translated character codes read by head 1 of Reader/Sorter 10.

During cycle D, FIG. 4, control signal PCDEC5−01, the output of decoder 52 is forced to logical ZERO enabling counters 94 and 96 to store the first translated character code received over signal bus ALUOT0-7+00 from MDC 6.

On the next clock cycle (cycle E, FIG. 4), a D flop 104 is set on the rise of the CLOCK signal when signal PDEC3−01 is at logical ZERO, thereby forcing the write pulse signal WRTXLT−00 to logical ZERO.

On the next clock cycle (cycle F, FIG. 4), the data stored in the status select registers 94 and 96 are written into address location 000 of RAMs 106 and 108 via signal lines RSSEL 0-7+00.

On the next cycle (cycle G, FIG. 4), control signal ADPPLS+00 is at logical ONE, thereby enabling a decoder 50, and signal PCDEC6−02 is forced to logical ZERO, thereby incrementing load data register 60 to 001; and, on the next cycle (cycle H, FIG. 4), the next data character is loaded into registers 94 and 96, and cycles D, E, F and G are repeated until the registers 58 and 60 store hexadecimal 7F. That is, signals LDDAT 1-7−00 are at logical ONE, indicating address location $127_{10}$. On the next increment load data register clock cycle (cycle G, FIG. 4), the carry signal LDDTCY−01 of register 60 is forced to logical ZERO, which increments load data register 58 on the next rise of the CLOCK signal. This forces the LDDAT0+00 signal to logical ONE, and signals LDDAT 1-7+00 to logical ZERO.

Also, the carry signal LDDTCY+01, output of an inverter 99, is applied to a NAND gate 98. Since signals LDDAT 1-3+00 are also at logical ONE during this cycle, the output signal LDDTCY−03 at logical ZERO is applied to the PT terminals of counter 102. This increments counter 102, and output signal XLTQD3+00 is forced to logical ONE. This enables the selection of address locations $128_{10}$ through $255_{10}$ of RAMs 106 and 108. This is shown in cycle I, FIG. 4.

Signals LDDAT0+00 at logical ONE and LDDAT1+00 at logical ZERO indicate to MDC 6 that the head 1 character sequence is completed and registers 58 and 60 store address location 000. When the head 2 character sequence is completed, counter 102 is incremented as described supra through NAND gate 98 and NOR gate 100, forcing signal XLTQD2+00 to logical ONE and XLTQD3+00 to logical ZERO. On the next clock cycle, signals LDDAT0+00 and LDDAT1+00 are at logical ZERO, indicating to the MDC 6 that the head 2 character sequence is completed.

Signal XLTQD2+00 at logical ONE selects RAMs 110 and 112, and the above sequence is repeated for the heads 3 and 4 character sequences. This time, when counter 102 is incremented, signal XLTQD1+00 is forced to logical ONE. This indicates to MDC 6 that the load operation is completed and, as shown in cycle J, FIG. 4, signal ATEST 2+00 is forced to logical ZERO in register 56. If signal XLTQD+00 is at logical ZERO, then in cycle J, FIG. 4, signal PCDEC3−01 is forced to logical ZERO by MDC 6 and the memory write flop 104 is set and cycle K is a write data cycle as in cycle E.

PROMs 114 and 116 of character decode lookup a table 40 receive character code signals RSDAT 1-7+00 and translation table quadrant signals XLTQD 1-3+00, and provide output signals DATDC 0-7+00, as described supra.

Following is a table identifying the logical elements of this embodiment:

| The TTL Data Book for Design Engineers, Second Edition, published by Texas Instruments | |
|---|---|
| Decoders 50, 52, 54 | 74LS138 |
| Counter/Register 58, 60, 94 96, 102 | 74LS169 |
| D Flop 104 | 74LS74 |
| MUX 42 | 74LS253 |
| Signetics Bipolar & MOS Memory Data Manual 1977 Edition, page 126 | |
| PROM 114, 116 | 82S137 |
| Signetics Logic - TTL Data Manual copyright 1978, page 625 | |
| Register 56 | 9334 |

Having shown and described a preferred embodiment of the invention, those skilled in the art will realize that many variations and modifications may be made to affect the described invention and still be within the scope of the claimed invention. Thus, many of the elements will provide the same results and fall within the spirit of the claimed invention. It is the intention, therefore, to limit the invention only as indicated by the scope of the claims.

What is claimed is:

1. A document processing system comprising:

a reader/sorter having at least one of a plurality of read heads for reading magnetic ink character recognition characters, optical mark recognition characters, or optical character recognition characters, or combinations thereof for reading their respective fields of documents and including means for generating character code signals during a store operation;

and adapter coupled to said reader/sorter during said store operation and having storing means responsive to said character code signals for generating corresponding translated character code signals during said store operation;

a data processing system coupled to said adapter and having means for receiving said translated character code signals for processing information from said documents during said store operation, said data processing system having means for generating said translated character code signals during a load operation;

said storing means during said load operation including:

receiving means coupled to said data processing system for receiving said translated character code signals;

character count means coupled to said data processing system for generating character count signals for receiving a first initial count, and being incremented for each of said translated character code signals receiving from said data processing system;

selection means coupled to said character count means and responsive to said character count signals for generating address location signals;

quadrant count means coupled to said data processing system and said character counting means for receiving a second initial count for generating quadrant count signals, and being incremented when said character counting means stores a predetermined value, said quadrant count signal being indicative of said one of said plurality of read heads; and, memory means coupled to said receiving means, said selection means, and said quadrant count means for storing said translated character code signals at an address location specified by said address location signals and said quadrant count signals, wherein said selection means is further responsive to said character code signals from said reader/sorter for generating said address location signals during said store operation;

said memory means being coupled to said selection means and said quadrant count means, and being responsive to said address location signals and said quadrant count signals, for generating said translated character code signals for transfer to said data processing system during said store operation.

2. The document processing system of claim 1 wherein said plurality of heads equals four.

3. The document processing system of claim 2 wherein said predetermined value equals 128.

4. The document processing system of claim 3 wherein said memory means comprises four quadrants, each of said quadrants comprising 128 of said address locations for storing said translated character code signals, each of said address locations of said quadrant being addressed by said address location signals generated by said selection means in response to character code signals from a particular read head of said reader/sorter.

* * * * *